US007375951B2

(12) United States Patent
Hash

(10) Patent No.: US 7,375,951 B2
(45) Date of Patent: May 20, 2008

(54) LOAD CONTROL DEVICE HAVING A SPLIT ENCLOSURE

(75) Inventor: Michael Hash, North Wales, PA (US)

(73) Assignee: Lutron Electronics Co., Inc., Coopersburg, PA (US)

( * ) Notice: Subject to any disclaimer, the term of this patent is extended or adjusted under 35 U.S.C. 154(b) by 92 days.

(21) Appl. No.: 11/483,374

(22) Filed: Jul. 7, 2006

(65) Prior Publication Data

US 2008/0007897 A1     Jan. 10, 2008

(51) Int. Cl.
*G01F 1/16* (2006.01)

(52) U.S. Cl. ............... 361/641; 361/643; 361/647; 361/678; 361/837; 307/115; 307/157; 200/600; 200/547; 200/33 R; 315/159; 315/112; 315/291; 315/307

(58) Field of Classification Search ........ 361/625, 361/628, 631, 641–648, 678, 688–690, 710–714, 361/837, 828; 307/146, 115, 157; 200/33 R, 200/547, 600; 315/112, 115, 291, 307; 338/165, 338/172, 191, 198; 174/50, 50.1, 50.5
See application file for complete search history.

(56) References Cited

U.S. PATENT DOCUMENTS

| 1,920,811 | A |   | 8/1933  | Schwabacher |
| 4,334,171 | A |   | 6/1982  | Parman et al. |
| 4,455,449 | A |   | 6/1984  | Rendel |
| 4,797,599 | A |   | 1/1989  | Ference et al. |
| 4,880,950 | A | * | 11/1989 | Carson et al. ............... 200/547 |
| 4,972,125 | A | * | 11/1990 | Cunningham et al. ...... 315/291 |
| 4,998,635 | A |   | 3/1991  | Vink et al. |
| 5,064,386 | A |   | 11/1991 | Dale et al. |
| 5,178,350 | A |   | 1/1993  | Vink et al. |
| 5,191,265 | A |   | 3/1993  | D'Aleo et al. |
| 5,237,207 | A | * | 8/1993  | Kwiatkowski et al. ........ 307/31 |

(Continued)

FOREIGN PATENT DOCUMENTS

EP          0614249 A          9/1994

(Continued)

OTHER PUBLICATIONS

European Patent Office, International Search Report and Written Opinion for Related PCT Application No. PCT/US2007/015076, Nov. 30, 2007, 15 pages.

*Primary Examiner*—Michael Datskovskiy
(74) *Attorney, Agent, or Firm*—Mark E. Rose

(57) ABSTRACT

A load control device is operable to receive a first control signal having a first magnitude and to generate a second control signal having a second magnitude. The load control device is adapted to be installed in an electrical wallbox having a barrier. The load control device comprises a split enclosure having first and second enclosure portions and a gap between the two portions. A first connector is provided in an opening of the first portion for receipt of the first control signal and a second connector is provided in an opening of the second portion for providing the second control signal. The gap of the split enclosure receives the barrier when the load control device is installed in the electrical wallbox, such that the first control signal is electrically isolated from the second control signal. Accordingly, the load control device meets the requirements of the National Electrical Code when installed in the electrical wallbox.

19 Claims, 10 Drawing Sheets

U.S. PATENT DOCUMENTS

| | | |
|---|---|---|
| 5,430,356 A | 7/1995 | Ference et al. |
| 5,445,539 A | 8/1995 | Dale |
| 5,463,286 A | 10/1995 | D'Aleo et al. |
| 5,838,533 A * | 11/1998 | Yazaryan et al. ........... 361/600 |
| 6,198,631 B1 * | 3/2001 | Radosavljevic et al. .... 361/704 |
| 6,225,760 B1 * | 5/2001 | Moan ........................ 315/360 |
| 6,259,351 B1 * | 7/2001 | Radosavljevic et al. .... 338/176 |
| 6,365,989 B1 * | 4/2002 | O'Donnell ................... 307/42 |
| 6,380,696 B1 | 4/2002 | Sembhi et al. |
| 6,483,031 B2 | 11/2002 | O'Donnell |
| 6,545,434 B2 | 4/2003 | Sembhi et al. |
| 6,653,561 B2 | 11/2003 | Lalancette et al. |
| 6,727,446 B1 * | 4/2004 | Mayo et al. ................. 200/296 |
| 6,839,165 B2 | 1/2005 | Jacoby, Jr. et al. |
| 6,987,449 B2 * | 1/2006 | Novikov ..................... 340/538 |
| 2005/0200284 A1 | 9/2005 | Thompson et al. |

FOREIGN PATENT DOCUMENTS

| | | |
|---|---|---|
| EP | 1230162 A | 6/2003 |
| EP | 1320162 A | 6/2003 |
| GB | 994893 A | 6/1965 |
| GB | 2 154805 A * | 9/1985 |

* cited by examiner

LOAD CONTROL DEVICE HAVING A SPLIT ENCLOSURE

BACKGROUND OF THE INVENTION

1. Field of the Invention

The present invention relates to a load control device for controlling the amount of power delivered from an alternating-current (AC) source to an electrical load. In particular, the present invention relates to a load control device for receiving a first control signal having a first magnitude and for generating a second control signal having a second magnitude substantially greater than the first magnitude.

2. Description of the Related Art

A conventional wall-mounted load control device is mounted to a standard electrical wall box and is coupled between a source of alternating-current (AC) power (typically 50 or 60 Hz line voltage AC mains) and an electrical load. Standard load control devices, such as dimmers and motor speed controls, use one or more semiconductor switches, such as triacs or field effect transistors (FETs), coupled in series between the source and the lighting load to control the power delivered to the load, and thus, the intensity of the lighting load or the speed of the motor. Using a phase-control dimming technique, the dimmer renders the semiconductor switch conductive for a portion of each line half-cycle to provide power to the lighting load, and renders the semiconductor switch non-conductive for the other portion of the line half-cycle to disconnect power from the load.

Often, wall-mounted load control devices are coupled to a digital communication link for transmitting and receiving digital control signals. For example, a GRAFIK Eye® Control Unit, manufactured by the assignee of the present invention, includes a plurality of dimming circuits for control of a plurality of lighting loads and is operable to be coupled to a remote control wallstation via a low-voltage digital communication link. The GRAFIK Eye Control Unit is operable to control each of the plurality of lighting loads in response to the digital control signals received from the remote control wallstation. The GRAFIK Eye Control Unit is described in greater detail in commonly-assigned U.S. Pat. No. 5,430,356, issued Jul. 4, 1995, entitled PROGRAMMABLE LIGHTING CONTROL SYSTEM WITH NORMALIZED DIMMING FOR DIFFERENT LIGHT SOURCES, the entire disclosure of which is hereby incorporated by reference.

The National Electrical Code (NEC) provides guidelines for the safe installation of electrical equipment and wiring. The National Electrical Code (2005 Edition) defines a "Class 2" circuit as "the portion of the wiring system between the load side of a Class 2 power source and the connected equipment". Class 2 AC circuits are generally limited to 42.4 volts peak and 100 VA. Class 2 direct-current (DC) circuits are generally limited to 60 volts and 100 VA. Class 2 circuits include, for example, thermostats, burglary and security systems, cables (twisted-pair or coaxial) that interconnect computers for Local Area Networks, and limited-energy voice, intercom, and sound systems. Low-voltage digital communication links coupled to lighting control devices, e.g., the GRAFIK Eye Control Units, are typically classified as Class 2 circuits.

Article 725.55 of the National Electrical Code (2005 Edition) states that Class 2 circuits may not be placed in the same enclosure as the conductors of electrical light and power wiring, except when necessary to connect to equipment utilizing the Class 2 circuit and the electrical light and power wiring is kept physically separated by a minimum of 6 mm (0.250") or operates at 150 volts or less to ground and the Class 2 circuits are installed appropriately with the proper grade of Class 3 cable. Since typical electrical loads and typical load control devices operate at 120 $V_{RMS}$ in the United States, the GRAFIK Eye Control Unit can be coupled to both a 120-$V_{RMS}$ power source and a Class 2 digital communication link and be installed in an electrical wallbox and still satisfy the National Electrical Code.

However, many electrical loads, such as electronic ballasts, require a higher voltage to operate, e.g., 277 $V_{RMS}$. According to the National Electrical Code, the GRAFIK Eye Control Unit cannot be coupled to both a 277 $V_{RMS}$ power source and a Class 2 digital communication link and be installed in a single electrical wallbox. Therefore, there is a need for a load control device for controlling a 277-$V_{AC}$ ballast in response to a digital control signal, where the load control device can be installed in a single wallbox such that the installation meets the requirements of the National Electrical Code.

SUMMARY OF THE INVENTION

According to the present invention, a load control device for installation in an electrical wallbox having a barrier comprises an electrical circuit, a first connector, a second connector, and a split enclosure. The electrical circuit is operable to receive a first voltage having a first magnitude and to receive a second voltage having a second magnitude substantially larger than the first magnitude. The first connector is operable to receive the first voltage and the second connector is operable to receive the second voltage. The split enclosure has first and second enclosure portions and a gap between said first and second enclosure portions. The gap is operable to receive the barrier of the electrical wallbox when the load control device is installed in the wallbox. The first connector is provided in a first opening of the first enclosure portion and the second connector is provided in a second opening of the second enclosure portion. Preferably, the load control device further comprises a support plate operable to mount the load control device to the wallbox, and a printed circuit board having the electrical circuit, the first connector, and the second connector mounted thereon, wherein the split enclosure and the printed circuit board are connected to the support plate such that the printed circuit board is contained between the split enclosure and the support plate. Further, the printed circuit board is preferably mounted to the support plate such that the printed circuit board is located externally to the electrical wallbox when the load control device is installed in the wallbox.

According to a second embodiment of the present invention, a load control device for controlling the amount of power delivered to an electrical load comprises: a support plate adapted for mounting the load control device to an electrical wallbox having a barrier; an enclosure adapted to be mounted in the electrical wallbox having the barrier; and an electrical circuit housed between the support plate and the enclosure. The electrical circuit is operable to couple a first voltage having a first magnitude and to couple a second voltage having a second magnitude substantially larger than the first magnitude. The first and second voltages are operable to transit the load control device through first and second openings in the enclosure, respectively. The first and second openings are adapted to be electrically isolated from each other by the barrier.

Other features and advantages of the present invention will become apparent from the following description of the invention that refers to the accompanying drawings.

DETAILED DESCRIPTION OF THE INVENTION

Figure 1:
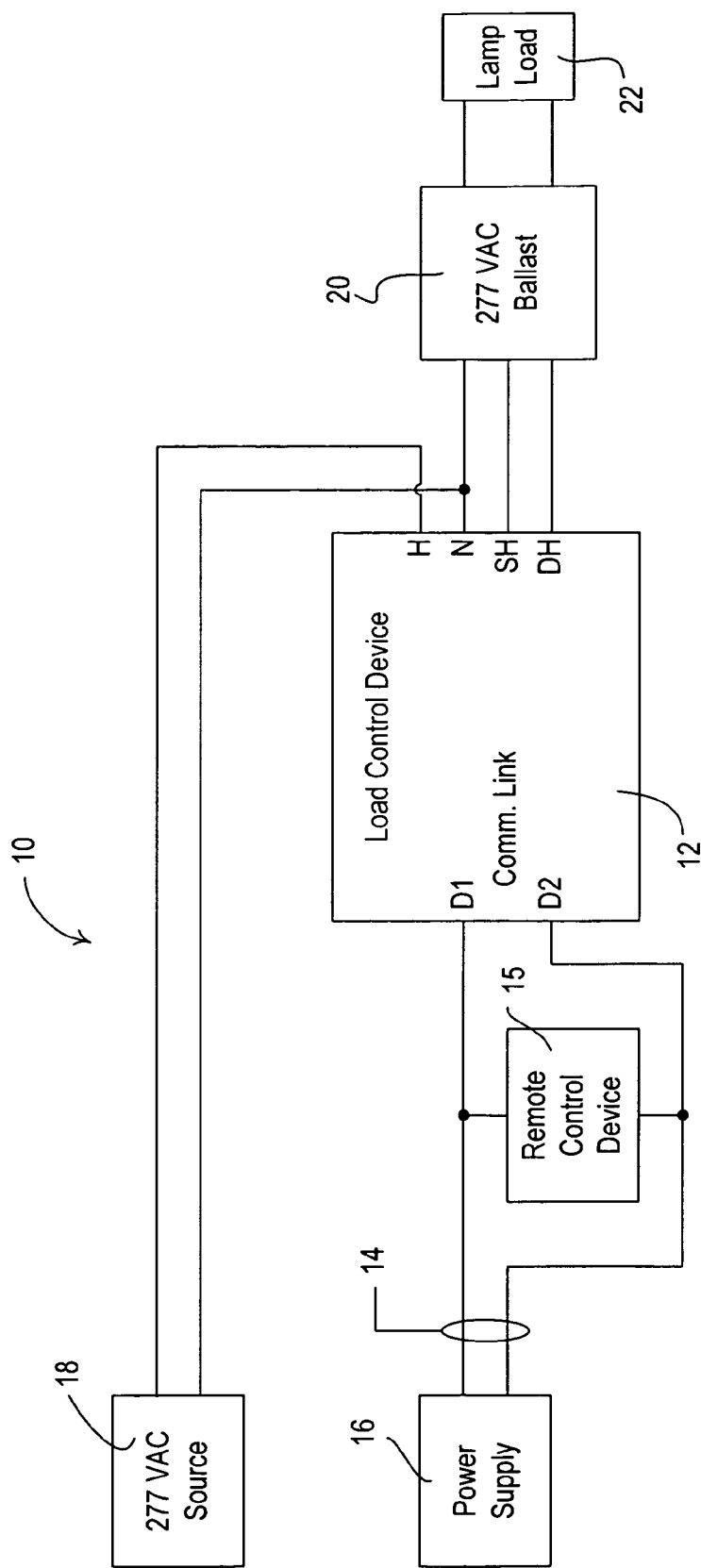
FIG. 1 is a simplified block diagram of a lighting control system including a load control device having a split enclosure according to the present invention.

The foregoing summary, as well as the following detailed description of the preferred embodiments, is better understood when read in conjunction with the appended drawings. For the purposes of illustrating the invention, there is shown in the drawings an embodiment that is presently preferred, in which like numerals represent similar parts throughout the several views of the drawings, it being understood, however, that the invention is not limited to the specific methods and instrumentalities disclosed.

FIG. 1 is a simplified block diagram of a lighting control system 10 including a load control device 12 according to the present invention. The load control device 12 is coupled to both a low-voltage communication link 14, i.e., a Class 2 communication link, and a 277-$V_{AC}$ power source 18, i.e., electrical light and power wiring. A remote control device 15 is also coupled to the communication link 14 and is operable to transmit digital control signals to the load control device 12 via the communication link. The communication link 14 may comprise, for example, a two-wire digital addressable lighting interface (DALI) communication link, as is well known in the art. The communication link 14 is powered by a power supply 16. The load control device 12 receives both wires of the communication link 14 at first and second data terminals D1, D2.

The load control device 12 also receives a hot connection and a neutral connection from the 277-$V_{AC}$ power source 18 at a hot terminal H and a neutral terminal N, respectively. The load control device 12 is operable to provide a 277-$V_{AC}$ dimmed hot signal at a dimmed hot output terminal DH to a 277-$V_{AC}$ ballast 20 in response to the digital control signals received on the communication link 14. The load control device 12 further provides a 277-$V_{AC}$ switched hot signal at a switched hot output terminal SH. The ballast 20 controls the intensity of a fluorescent lamp 22 in response to the 277-$V_{AC}$ dimmed hot signal. Accordingly, a user is operable to control an intensity adjustment actuator (not shown) of the remote control device 15 to adjust the intensity of the fluorescent lamp 22.

Figure 2:
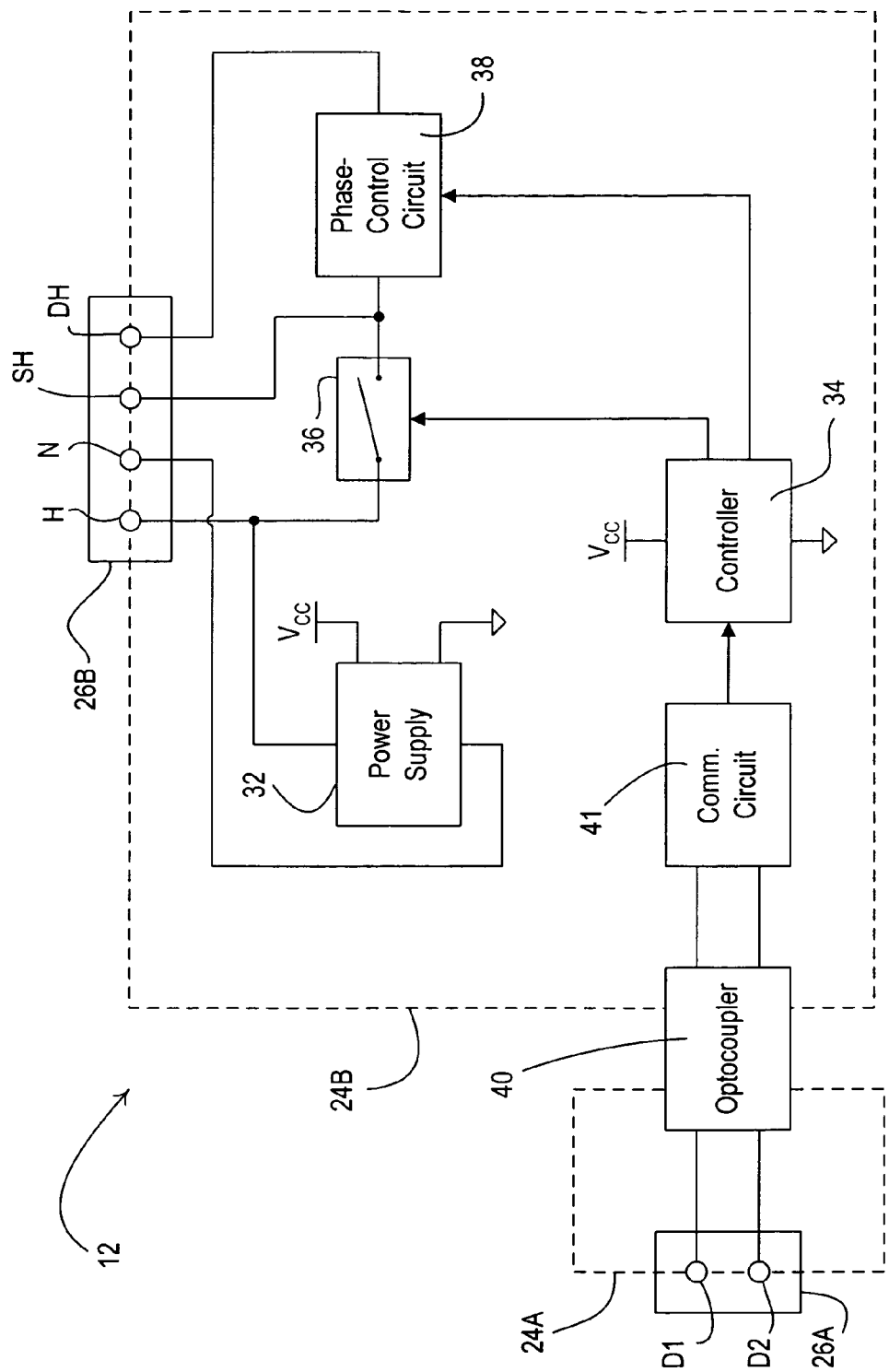
FIG. 2 is a simplified block diagram of the load control device of FIG. 1.

FIG. 2 is a simplified block diagram of the load control device 12 according to the present invention. The load control device 12 comprises a first circuit portion 24A and a second circuit portion 24B. The first circuit portion 24A includes a first connector 26A, which is coupled to the communication link 14 at the data terminals D1, D2. The second circuit portion 24B includes a second connector 26B for receipt of the hot and neutral connections of the 277-$V_{AC}$ power source 18 at the hot terminal H and the neutral terminal N. The second connector 26B also provides the 277-$V_{AC}$ dimmed hot signal at the dimmed hot output terminal DH and the 277-$V_{AC}$ switched hot signal at the switched hot output terminal SH. A power supply 32 is coupled between hot and neutral of the 277-$V_{AC}$ power source 18 for generating a direct-current (DC) voltage $V_{CC}$ for powering a controller 34.

The controller 34 is operable to open and close a mechanical switch, e.g., a relay 36, which is coupled between the hot terminal H and the switched hot output terminal SH. Further, the controller 34 is operable to control a phase control circuit 38, which is coupled between the switched hot output terminal SH and the dimmed hot output terminal DH. The controller 34 preferably controls the conduction time of a semiconductor switch (not shown) of the phase control circuit 38 to generate the 277-$V_{AC}$ dimmed hot signal.

An optocoupler 40 couples the digital control signals from the communication link 14 to a communication circuit 41, such that the first circuit portion 24A is electrically isolated from the second circuit portion 24B. The communication circuit 41 is operable to provide the digital control signals to the controller 34 at an appropriate voltage level, i.e., referenced between the DC voltage $V_{CC}$ of the power supply 32 and circuit common. The controller 34 is operable to turn the fluorescent lamp 22 on and off via the 277-$V_{AC}$ switched hot signal and to control the intensity of the fluorescent lamp via the 277-$V_{AC}$ dimmed hot signal in response to the digital control signals received via the communication link 14.

Alternatively, the communication link 14 could comprise a four-wire communication link, for example, an RS-485 communication link. Accordingly, the first connector 26A will have four terminals for connection to the four-wire RS-485 communication link. With an RS-485 communication link, the four wires comprise a common conductor, a power supply voltage conductor, and two data conductors (for transmission of the digital control signals). The optocoupler 40 and the communication circuit 41 may be implemented on a single integrated circuit (IC), for example, part number MAX1480B, manufactured by Maxim Integrated Products.

Figure 3:
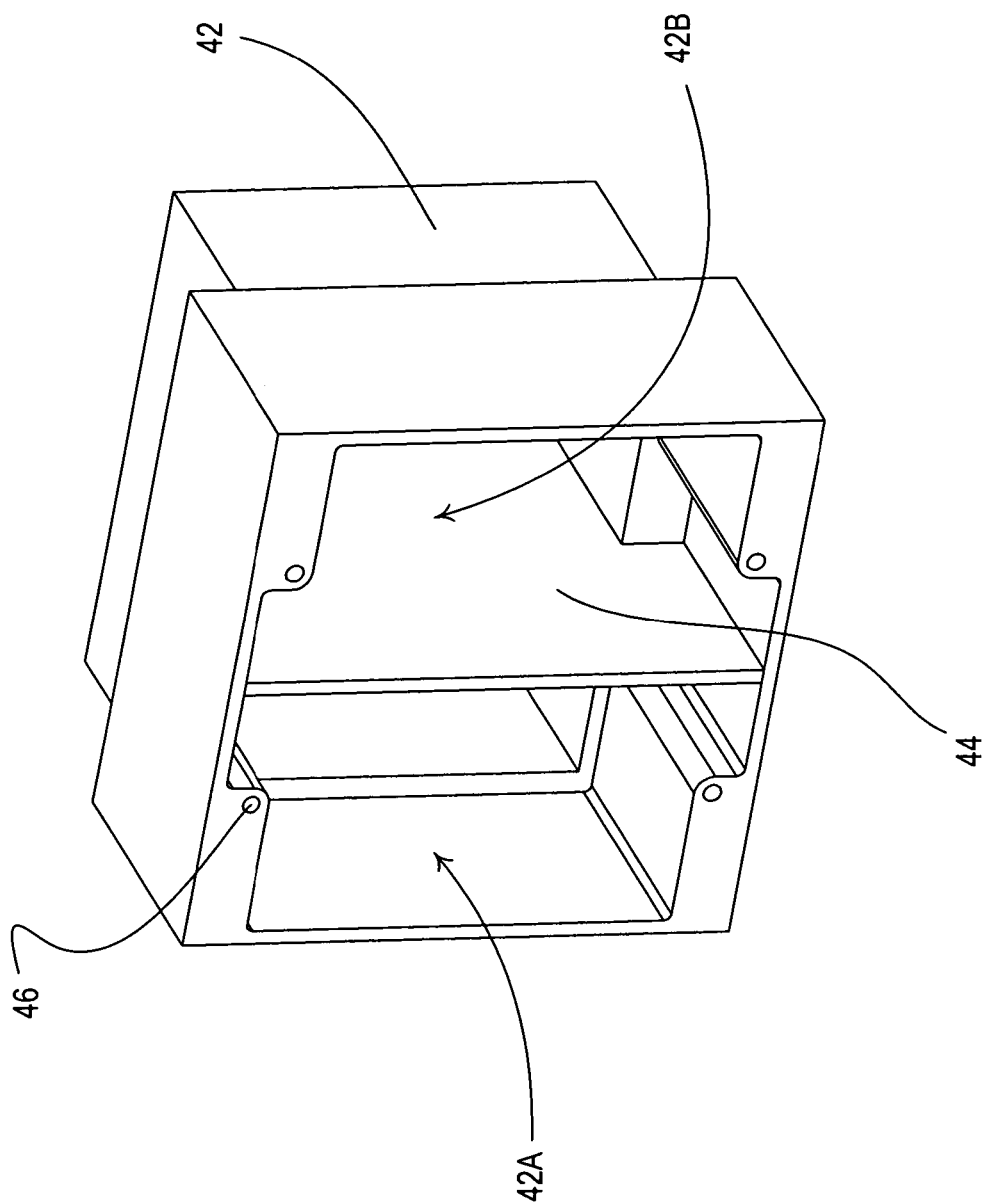
FIG. 3 is a perspective view of a two-gang wallbox having a barrier.

Since the Class 2 communication link 14 and the wiring of the 277-$V_{AC}$ power source 18 may not be located in the same wallbox according to the National Electrical Code, the load control device 12 is adapted to be installed in a split wallbox, for example, the two-gang wallbox 42 of FIG. 3, which has a barrier 44 separating the wallbox 42 into two sections 42A, 42B. The barrier provides electrical isolation between the wallbox sections 42A, 42B. Often, the barrier 44 of such a wallbox 42 is removable. The load control device 12 of the present invention is operable to be installed in the two-gang wallbox 42 with the first connector 26A on one side of the barrier 44 and the second connector 26B on the other side of the barrier 44. Note that the load control device 12 of the present invention could alternatively be designed to be mounted in a three-gang or larger wallbox.

Figure 4A:
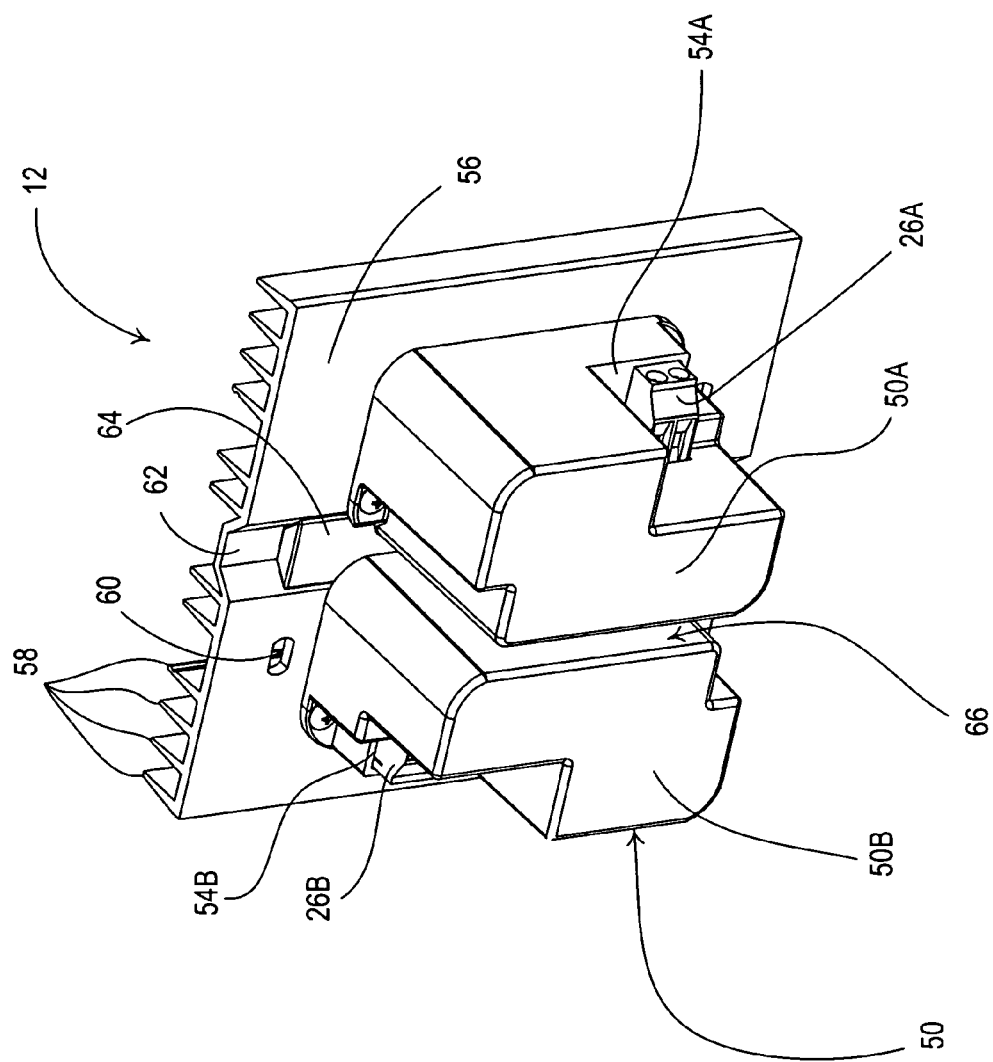
FIG. 4A is a rear perspective view of the load control device of FIG. 1 showing first and second portions of the split enclosure according to a first embodiment of the present invention.
Figure 4B:
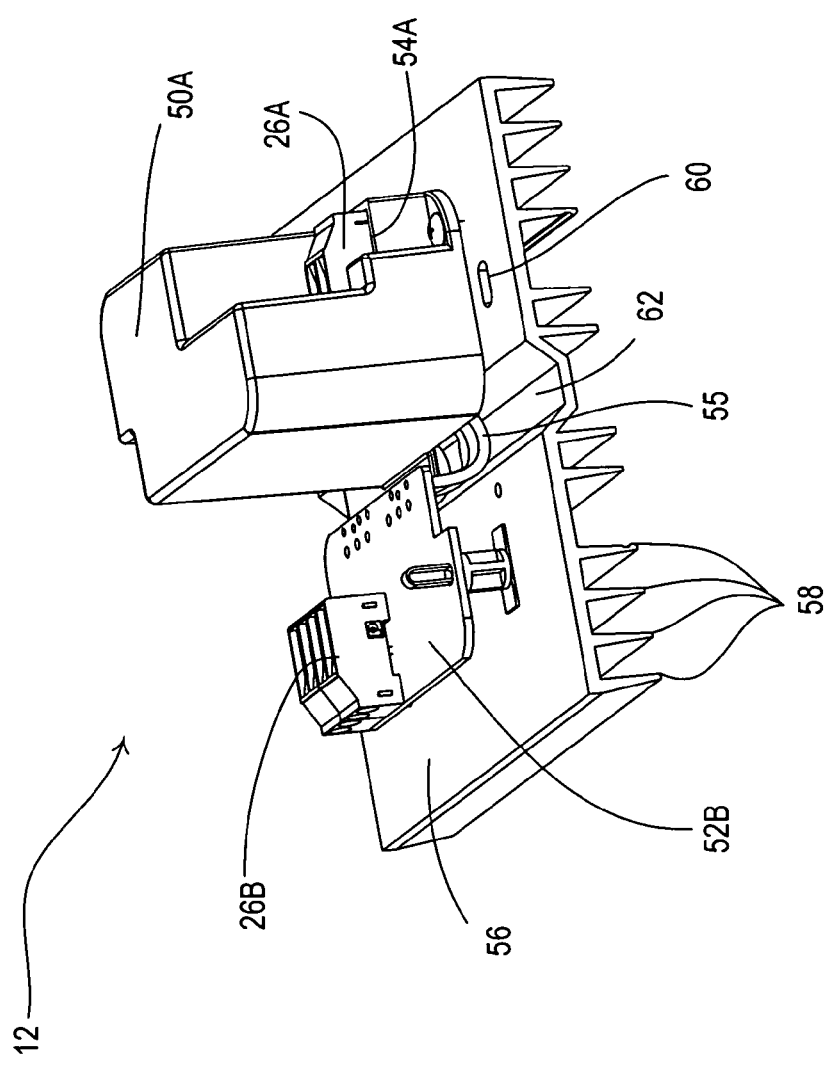
FIG. 4B is a bottom perspective view showing the load control device of FIG. 4A with the second portion of the split enclosure removed.
Figure 4C:
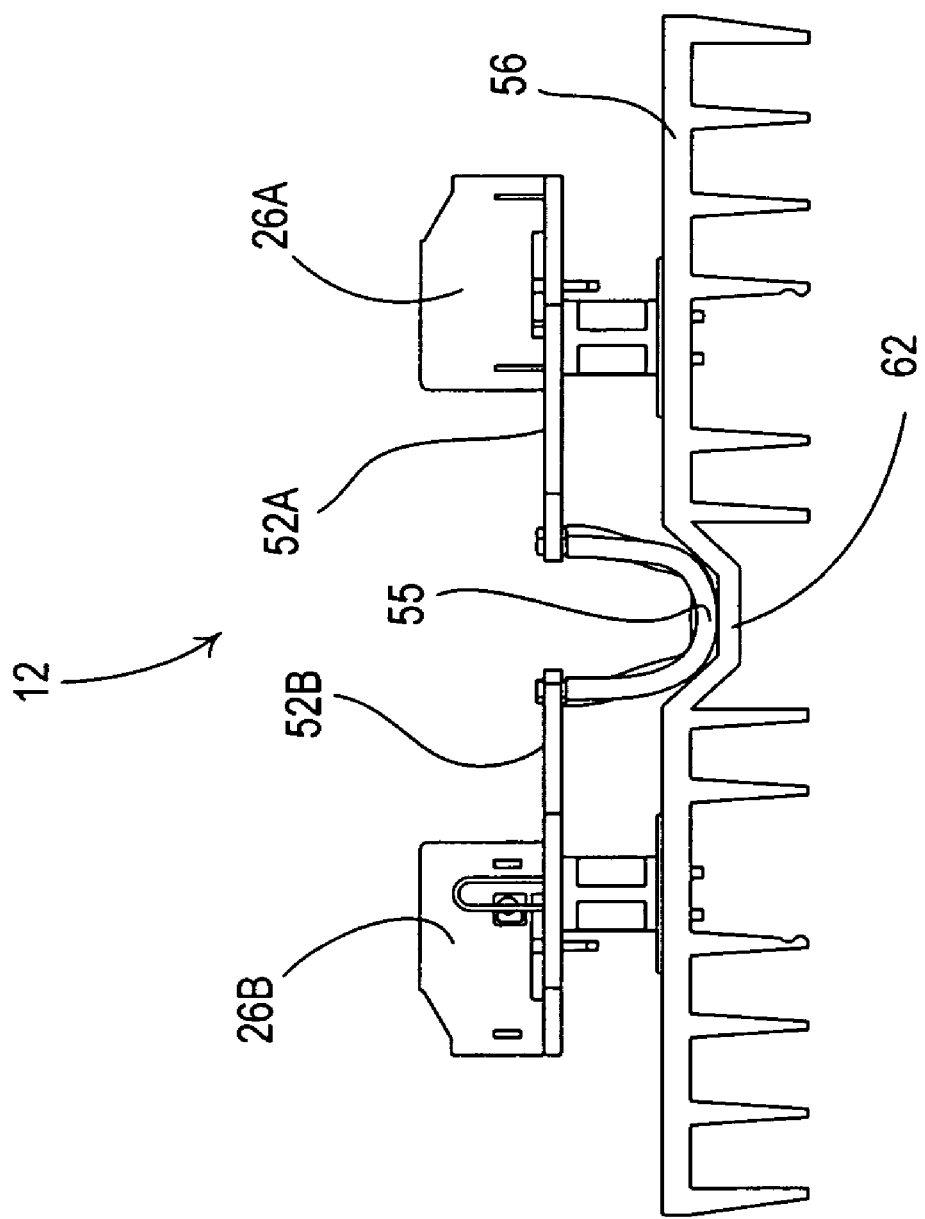
FIG. 4C is a bottom view of load control device of FIG. 4A with both portions of the split enclosure removed.

FIGS. 4A-4C show the load control device 12 according to a first embodiment of the present invention. FIG. 4A is a rear perspective view of the load control device 12 showing first and second portions 50A, 50B of a split enclosure 50. FIG. 4B is a bottom perspective view showing the load control device 12 with the second portion 50B of the split enclosure 50 removed. FIG. 4C is a bottom view of load control device 12 with both portions 50A, 50B of the split enclosure 50 removed.

First and second printed circuit boards (PCBs) 52A, 52B are housed in the first and second portions 50A, 50B of the enclosure, respectively. The first connector 26A is mounted on the first PCB 52A, while the second connector 26B is mounted on the second PCB 52B. The first and second connectors 26A, 26B are provided in openings 54A, 54B of the first and second portions 50A, 50B of the split enclosure 50, respectively. The first and second circuit portions 24A, 24B are mounted on the first and second PCBs 52A, 52B, such that the first and second circuit portions are separated by enough distance to maintain the electrical isolation between the two circuit portions. The first and second PCBs 52A, 52B are connected via a PCB communication link, e.g., a ribbon cable 55. Alternatively, the PCB communication link could be implemented as an infrared (IR) communication link or a radio-frequency (RF) communication link.

The first and second portions 50A, 50B of the split enclosure 50 and the first and second PCBs 52A, 52B are mounted to a support plate 56. The support plate 56 acts as a faceplate for the load control device 12 when the load control device is mounted in an electrical wallbox. The support plate 56 also functions as a heat sink to dissipate heat generated in the semiconductor switch of the phase-control circuit 38. The support plate 56 comprises a plurality of fins 58 to assist with the cooling of the support plate. The support plate 56 includes mounting holes 60 for receipt of a screw (not shown) to be connected to the screw holes 46 of the wallbox 42. The support plate 56 also includes a channel 62, which allows the ribbon cable 55 to be connected between the first and second PCBs 52A, 52B as shown in FIG. 4C. The first and second portions 50A, 50B of the split enclosure 50 have extensions 64 that seal the channel 60 of the support plate 56 and prevent external materials from entering the interior of the load control device 12.

The first and second portions 50A, 50B of the split enclosure 50 are spaced apart by a gap 66. The load control device 12 is operable to be mounted in the two-gang wallbox 42 having the barrier 44, such that the barrier is received in the gap 66 between the first and second portions. Accordingly, the first and second connectors 26A, 26B will be separated by the barrier 44, and thus, the voltages of the communication link 14 and the 277-$V_{AC}$ power source 18 will be separated appropriately to satisfy the National Electrical Code.

Figure 5A:
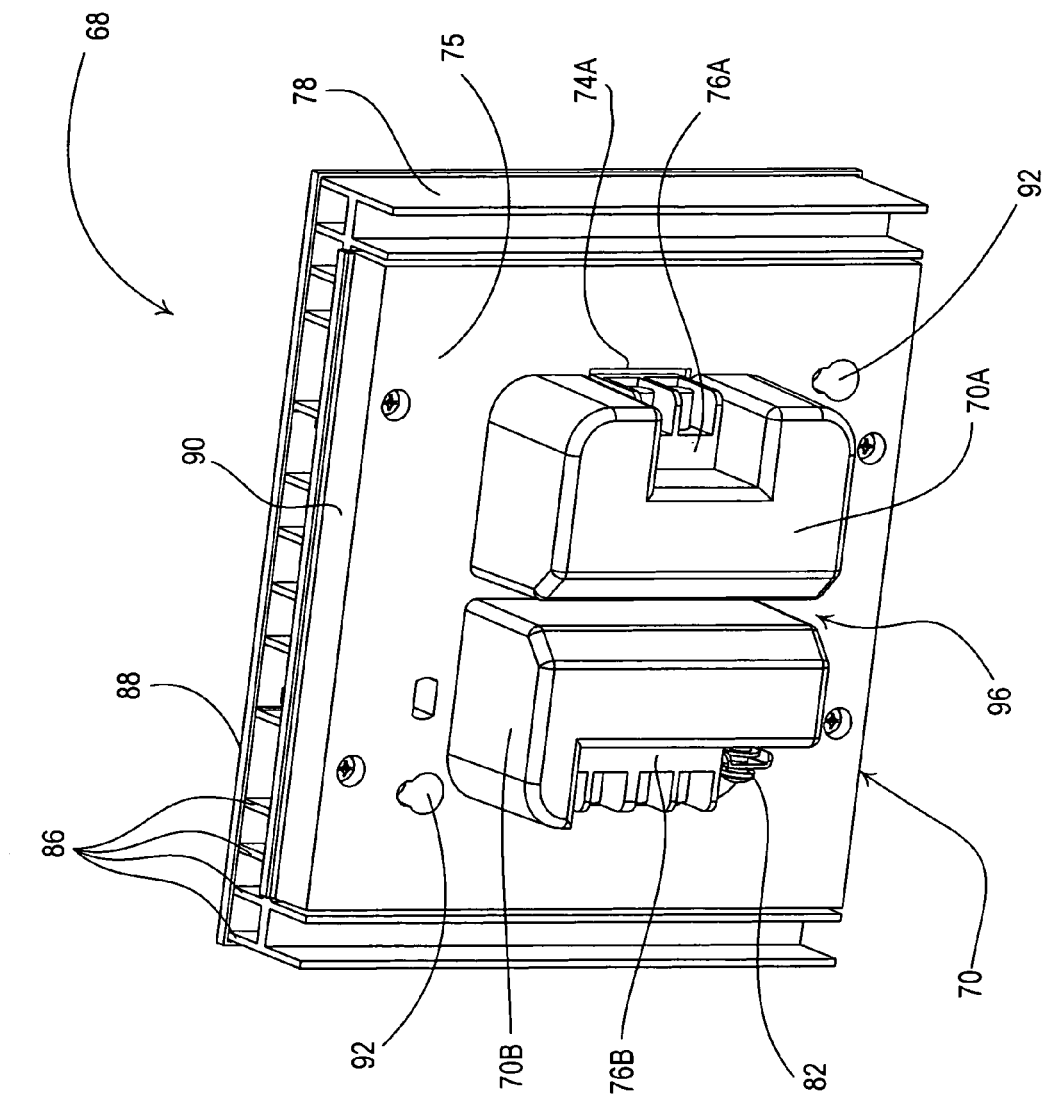
FIG. 5A is a rear perspective view of a load control device showing first and second portions of a split enclosure according to a second and preferred embodiment of the present invention.
Figure 5B:
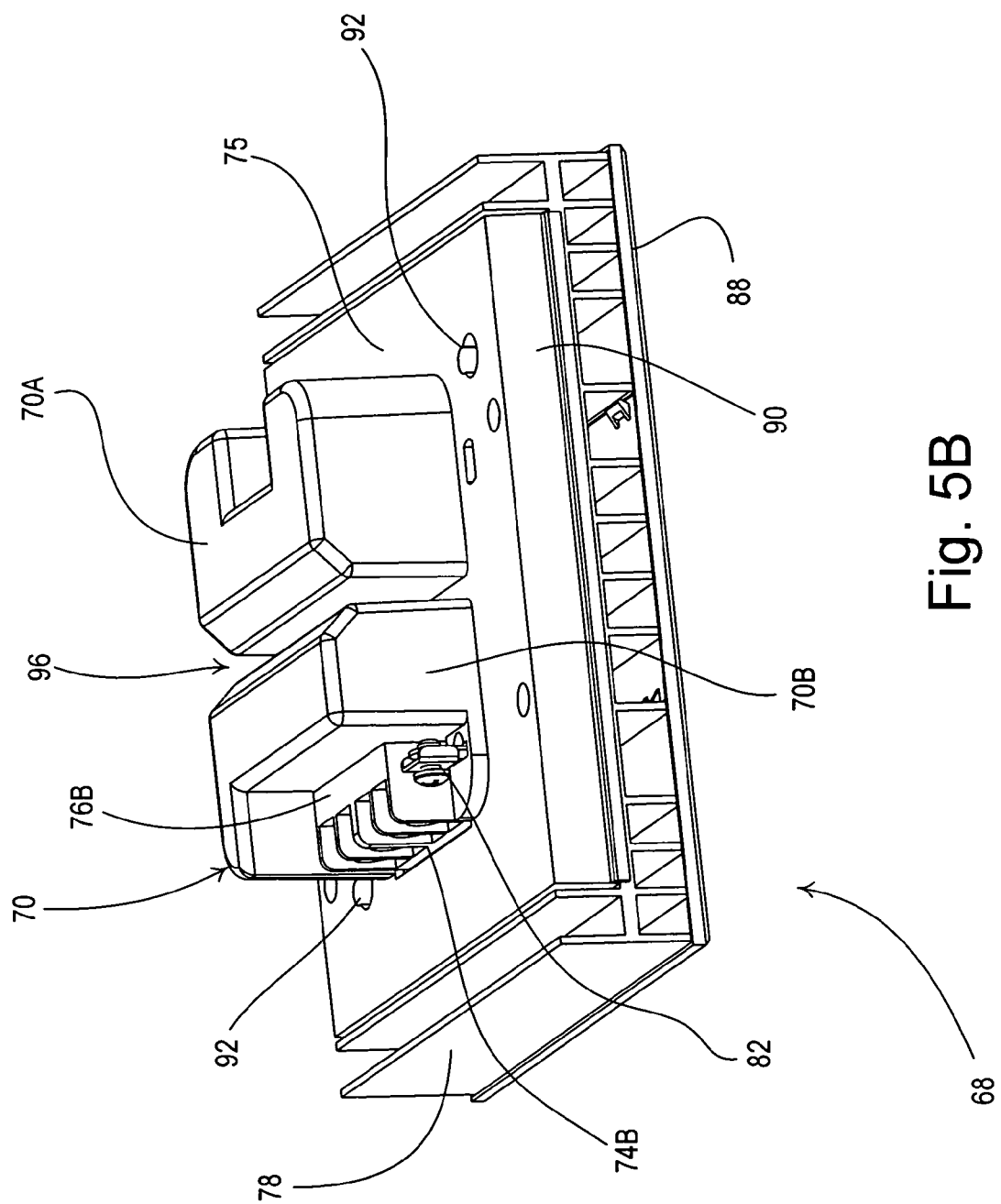
FIG. 5B is a bottom perspective view of the load control device of FIG. 5A showing first and second portions of the split enclosure.
Figure 5C:
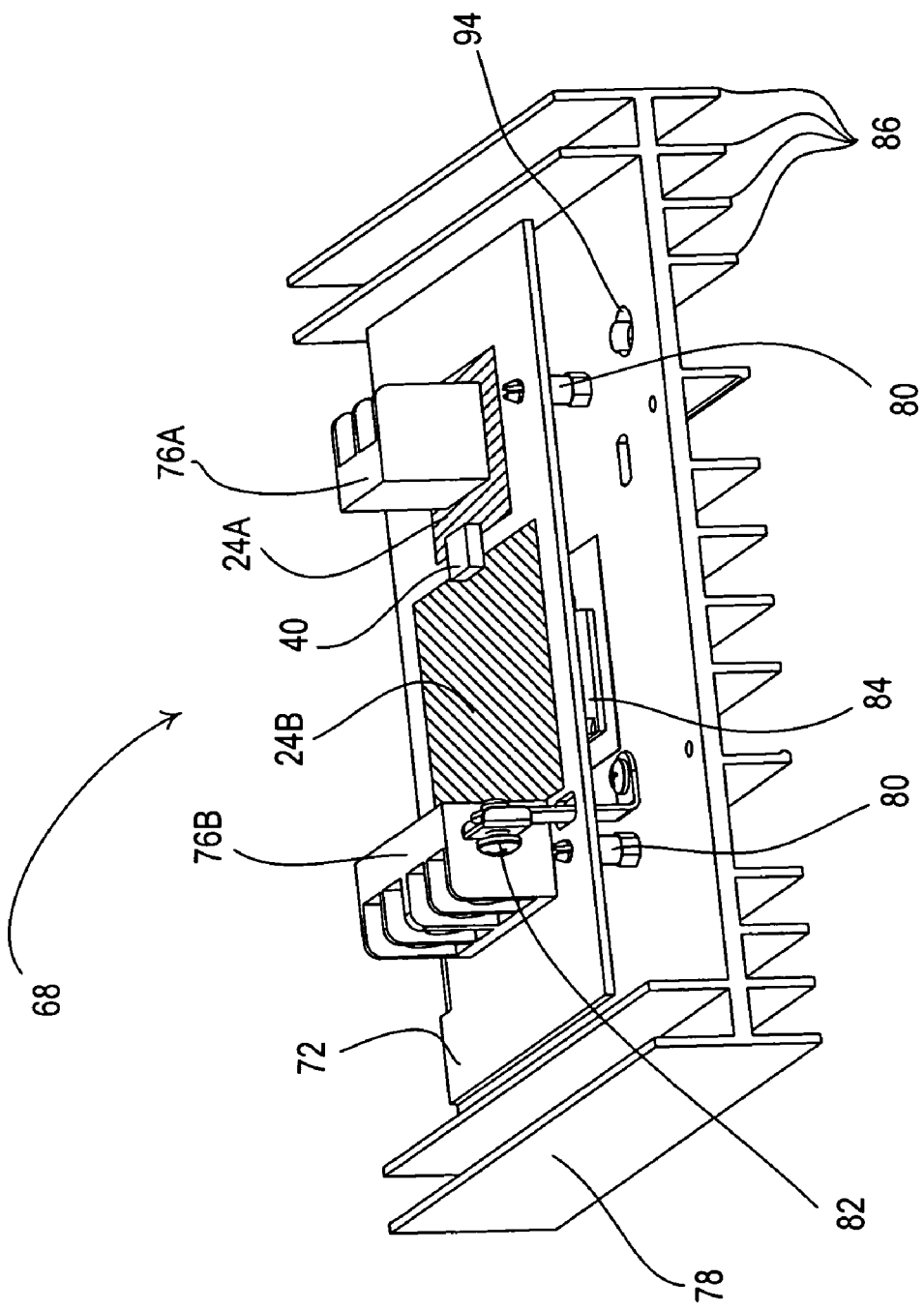
FIG. 5C is a bottom perspective view of the load control device of FIG. 5A with both portions of the split enclosure removed.
Figure 5D:
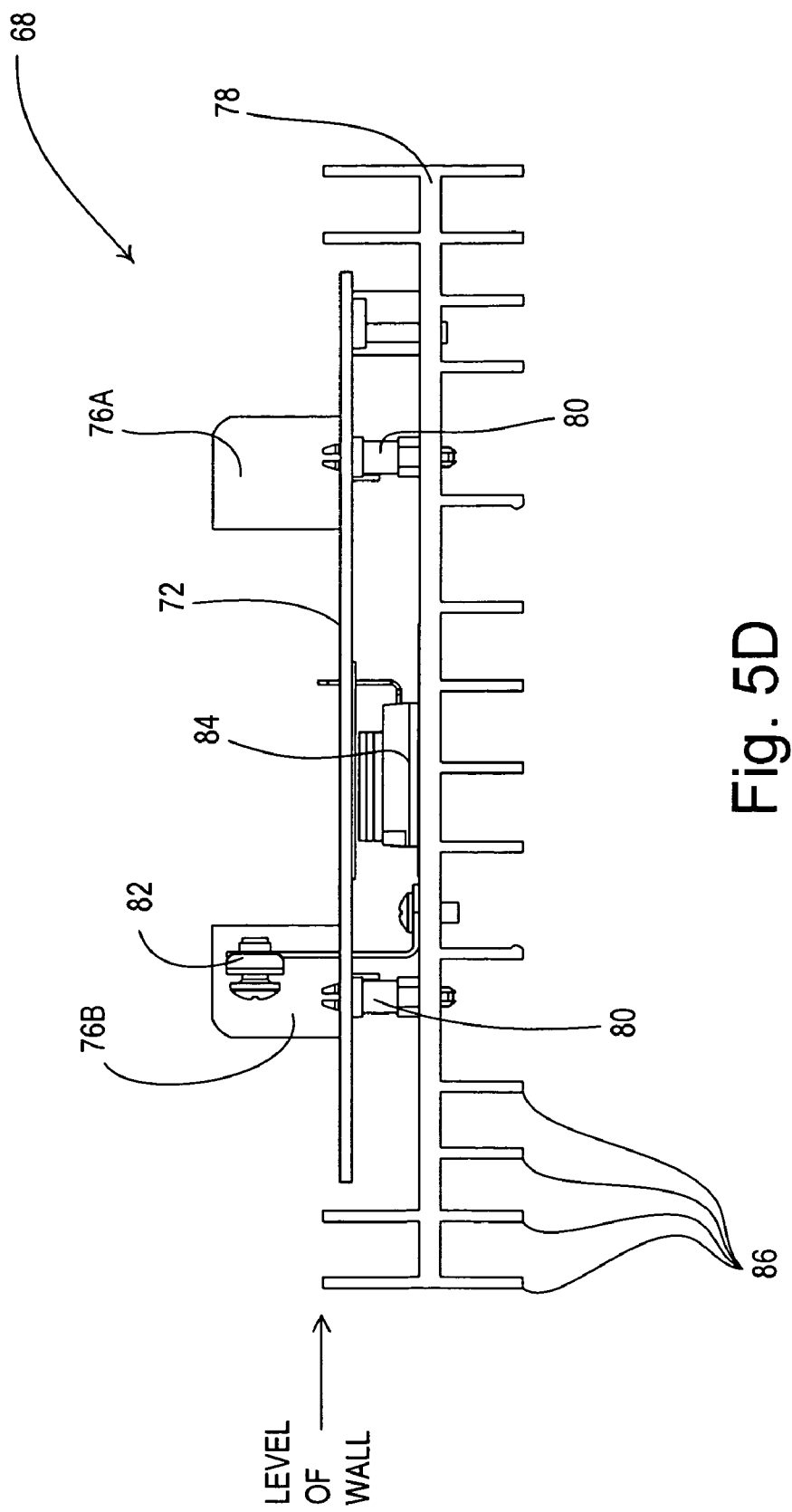
FIG. 5D is a bottom view of the load control device of FIG. 5A with both portions of the split enclosure removed.

FIGS. 5A-5D show a load control device 68 having a split enclosure 70 according to a second and preferred embodiment of the present invention. FIG. 5A is a rear perspective view and FIG. 5B is a bottom perspective view of the load control device 68 showing first and second portions 70A, 70B of the split enclosure 70. FIG. 5C is a bottom perspective view and FIG. 5D is a bottom view of the load control device 68 with both portions 70A, 70B of the split enclosure 70 removed.

The load control device 68 has a single PCB 72, on which is mounted both the first and second circuit portions 24A, 24B. The first and second circuit portions 24A, 24B are separated, for example, by a distance of 0.060 inches, and are coupled together via the optocoupler 40, such that the first and second circuit portions are electrically isolated. First and second connectors 76A, 76B are mounted on the PCB 72 and comprise the same terminals as the first and second connectors 26A, 26B of the load control device 12 according to the first embodiment. The first connector 76A is located in an opening 74A of the first portion 70A of the split enclosure 70 and the second connector 76B is located in an opening 74B of the second portion 70B. The split enclosure 70 comprises a base portion 75 to which the first and second portions 70A, 70B are affixed.

The PCB 72 is attached to a support plate 78 via attachment posts 80. A grounding lug 82 is attached to the support plate 78 to allow the load control device 68 to be connected to earth ground. As with the load control device 12, the support plate 78 functions as a heat sink for a semiconductor switch 84, i.e., the semiconductor switch of the phase-control circuit 38, which is thermally coupled to the support plate (as shown in FIG. 5D). The support plate 78 comprises a plurality of fins 86 to allow for cooling of the support plate. A faceplate 88 is removably attached to the fins 86 of the support plate 78 to provide an improved aesthetic appearance of the load control device 68.

The PCB 72 is housed by the base portion 75 of the split enclosure 70 such that the PCB 72 is located outside the electrical wallbox (not shown) to which the load control device 68 is mounted (note the level of the wall as shown in FIG. 5D). The base portion 75 comprises sidewalls 90, which prevent external materials from entering the interior of the load control device 68. The base portion 75 further comprises mounting holes 92 that align with corresponding mounting holes 94 in the support plate 78. The mounting holes 92, 94 allow the load control device 68 to be mounted to the wallbox 42.

Similarly to the load control device 12 of the first embodiment, the load control device 86 of the second embodiment includes a gap 96 between the first and second portions 70A, 70B of the split enclosure 70. Accordingly, the load control device 86 can be mounted in the wallbox 42 having the barrier 44, such that the installation meets the requirements set forth by the National Electrical Code.

Although the present invention has been described with reference to a load control device for controlling a 277-$V_{AC}$ ballast in response to a digital control signal received via a digital communication link, the present invention could be applied to any load control device that is operable to receive two voltages that need to be separated in an electrical wallbox, for example, to satisfy an electrical standard such as the National Electrical Code. For example, rather than receiving a digital control signal via a communication link, the load control device could be operable to control a ballast in response to a phase-control signal having a first magnitude. The ballast may be rated to operate at an operating voltage having a second magnitude, such that conductors at the first and second magnitudes may not be located within the same enclosure. Using the split enclosure of the present invention, the load control device can be installed in a single electrical wallbox to receive the first phase-control signal at the first magnitude and generate a second phase-control signal at the second magnitude, while satisfying the requirements of the National Electrical Code. The electrical circuitry of such a load control device, which is often called a "power booster", is described in greater detail in commonly-assigned U.S. Pat. No. 4,797,599, issued Jun. 10, 1989, entitled POWER CONTROL CIRCUIT WITH PHASE CONTROLLED SIGNAL INPUT, the entire disclosure of which is hereby incorporated by reference.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A load control device for installation in an electrical wallbox having a barrier, the load control device comprising:
    an electrical circuit operable to receive a first voltage having a first magnitude and to receive a second voltage having a second magnitude substantially larger than the first magnitude;
    a first connector operable to receive the first voltage;
    a second connector operable to receive the second voltage; and
    a split enclosure having first and second enclosure portions and a gap between said first and second enclosure portions, the gap operable to receive the barrier of the electrical wallbox when the load control device is installed in the wallbox;
    wherein the first connector is provided in a first opening of the first enclosure portion and the second connector is provided in a second opening of the second enclosure portion.

2. The load control device of claim 1, further comprising: first and second printed circuit boards;
    wherein the electrical circuit comprises first and second circuit portions, the first circuit portion and the first connector mounted on the first printed circuit board, the second circuit portion and the second connector mounted on the second printed circuit board, the first and second circuit portions housed in the first and second enclosure portions of the split enclosure, respectively.

3. The load control device of claim 2, further comprising:
    a support plate;
    wherein the first enclosure portion and the first printed circuit board are connected to the support plate such that the first printed circuit board is contained between the first enclosure portion and the support plate, and the second enclosure portion and the second printed circuit board are connected to the support plate such that the second printed circuit board is contained between the second enclosure portion and the support plate.

4. The load control device of claim 3, further comprising:
    a communication link for coupling the first and second electrical circuits to each other.

5. The load control device of claim 4, wherein the support plate further comprises a channel operable to receive the communication link.

6. The load control device of claim 5, wherein the split enclosure further comprises extensions adapted to fit in the channel to prevent external materials from entering the load control device.

7. The load control device of claim 4, wherein the communication link comprises a ribbon cable.

8. The load control device of claim 4, wherein the communication link comprises an infrared communication link.

9. The load control device of claim 4, wherein the communication link comprises an RF communication link.

10. The load control device of claim 3, wherein the first and second printed circuit boards are located inside the electrical wallbox.

11. The load control device of claim 1, further comprising:
    a support plate operable to mount the load control device to the wallbox; and
    a printed circuit board having the electrical circuit, the first connector, and the second connector mounted thereon;
    wherein the split enclosure and the printed circuit board are connected to the support plate such that the printed circuit board is contained between the split enclosure and the support plate.

12. The load control device of claim 11, wherein the printed circuit board is mounted to the support plate such that the printed circuit board is located externally to the electrical wallbox.

13. The load control device of claim 11, wherein the split enclosure further comprises a base portion having sidewalls to prevent external materials from entering the load control device.

14. The load control device of claim 1, wherein the electrical circuit is operable to receive a first control signal having the first magnitude at the first connector and to generate a second control signal having the second magnitude at the second connector.

15. The load control device of claim 14, wherein the first control signal comprises a 120-volt phase-control signal and the second control signal comprises a 277-volt phase-control signal.

16. The load control device of claim 14, wherein the first connector is operable to be coupled to a Class 2 communication link and the second control signal comprises a 277-volt phase-control signal.

17. The load control device of claim 14, wherein the load control device is operable to control a 277-volt ballast.

18. A load control device for installation in an electrical wallbox having a barrier, the load control device comprising:
    a support plate operable to mount the load control device to the wallbox;
    a split enclosure having first and second enclosure portions and a gap between said first and second enclosure portions, the gap operable to receive the barrier of the electrical wallbox when the load control device is installed in the wallbox;
    a printed circuit board housed between the support plate and the split enclosure;
    an electrical circuit mounted on the printed circuit board, the electrical circuit operable to receive a first voltage having a first magnitude and to receive a second voltage having a second magnitude substantially larger than the first magnitude;
    a first connector mounted on the printed circuit board and operable to receive the first voltage, the first connector provided in a first opening of the first enclosure portion; and
    a second connector mounted on the printed circuit board and operable to receive the second voltage, the second connector provided in a second opening of the second enclosure portion;
    wherein the printed circuit board is located externally to the electrical wallbox when the load control device is installed in the wallbox.

19. A load control device for controlling the amount of power delivered to an electrical load, the load control device comprising:

a support plate adapted for mounting the load control device to an electrical wallbox having a barrier;

an enclosure adapted to be mounted in the electrical wallbox having the barrier; and an electrical circuit housed between the support plate and the enclosure, the electrical circuit operable to couple a first voltage having a first magnitude and to couple a second voltage having a second magnitude substantially larger than the first magnitude;

wherein the first and second voltages are operable to transit the load control device through first and second openings in the enclosure, respectively, the first and second openings adapted to be electrically isolated from each other by the barrier.

\* \* \* \* \*